(12) United States Patent
Wang et al.

(10) Patent No.: US 12,068,298 B2
(45) Date of Patent: Aug. 20, 2024

(54) HIGH POWER DENSITY 3D SEMICONDUCTOR MODULE PACKAGING

(71) Applicants: Dynex Semiconductor Limited, Lincolnshire (GB); Zhuzhou CRRC Times Semiconductor Co. Ltd., Hunan (CN)

(72) Inventors: Yangang Wang, Lincolnshire (GB); Haihui Luo, Hunan (CN); Guoyou Liu, Hunan (CN)

(73) Assignees: DYNEX SEMICONDUCTOR LIMITED, Lincolnshire (GB); ZHUZHOU CRRC TIMES ELECTRIC CO. LTD., Zhuzhou (CN)

(*) Notice: Subject to any disclaimer, the term of this patent is extended or adjusted under 35 U.S.C. 154(b) by 449 days.

(21) Appl. No.: 17/430,754

(22) PCT Filed: Nov. 2, 2020

(86) PCT No.: PCT/CN2020/125889
§ 371 (c)(1),
(2) Date: Aug. 13, 2021

(87) PCT Pub. No.: WO2022/088179
PCT Pub. Date: May 5, 2022

(65) Prior Publication Data
US 2022/0352137 A1    Nov. 3, 2022

(51) Int. Cl.
*H01L 25/18* (2023.01)
*H01L 23/00* (2006.01)
(Continued)

(52) U.S. Cl.
CPC ............ *H01L 25/18* (2013.01); *H01L 25/071* (2013.01); *H01L 25/50* (2013.01); *H01L 23/24* (2013.01);
(Continued)

(58) Field of Classification Search
CPC ....... H01L 21/50; H01L 25/18; H01L 25/072; H01L 25/074; H01L 21/54; H01L 25/50;
(Continued)

(56) References Cited

U.S. PATENT DOCUMENTS 5,424,919 A * 6/1995 Hielbronner .......... H01L 25/071
165/185
6,014,313 A * 1/2000 Hesselbom .......... H01L 25/0652
174/16.3
(Continued)

FOREIGN PATENT DOCUMENTS

CN         1333566 A      1/2002
DE    102014221124 A1    4/2016
(Continued)

OTHER PUBLICATIONS

International Search Report and Written Opinion dated Jun. 28, 2021 for corresponding International Application No. PCT/CN2020/125889.
(Continued)

*Primary Examiner* — Mouloucoulaye Inoussa
(74) *Attorney, Agent, or Firm* — Tarolli, Sundheim, Covell & Tummino LLP

(57) ABSTRACT

We herein describe a semiconductor device sub-assembly comprising at least two power semiconductor devices and a contact of a first type. A first power semiconductor device is located on a first side of the contact of a first type, and a second power semiconductor device is located on a second side of the contact of a first type, where the second side is opposite to the first side.

18 Claims, 5 Drawing Sheets

(51) Int. Cl.
*H01L 23/24* (2006.01)
*H01L 25/00* (2006.01)
*H01L 25/07* (2006.01)

(52) U.S. Cl.
CPC .............. *H01L 24/32* (2013.01); *H01L 24/33* (2013.01); *H01L 2224/32245* (2013.01); *H01L 2224/33181* (2013.01); *H01L 2924/10272* (2013.01); *H01L 2924/1033* (2013.01); *H01L 2924/1203* (2013.01); *H01L 2924/13055* (2013.01); *H01L 2924/15747* (2013.01)

(58) Field of Classification Search
CPC ..... H01L 23/051; H01L 25/071; H01L 21/60; H01L 23/488; H01L 23/3675; H01L 23/5384; H01L 23/5385; H01L 23/5389; H01L 24/09; H01L 25/0652; H01L 25/0655; H01L 25/0657; H01L 25/117; H01L 29/7395; H01L 41/083; H01L 23/473; H01L 23/5386; H01L 25/115; H01L 23/13; H01L 23/58; H01L 23/36; H01L 23/3677; H01L 23/49551; H01L 23/3114; H01L 23/3735; H01L 23/4334; H01L 24/32; H01L 24/83; H01L 23/49537; H01L 23/49861; H01L 23/49562; H01L 24/20; H01L 23/492; H01L 23/49575; H01L 24/19; H01L 23/49568; H01L 23/49811; H01L 2924/1203; H01L 2224/32245; H01L 2224/8384; H01L 2924/10272; H01L 2924/13055; H01L 2224/0401; H01L 2224/05085; H01L 2224/0603; H01L 2224/06181; H01L 2224/1403; H01L 2224/29139; H01L 2224/32225; H01L 2224/73204; H01L 2224/73253; H01L 2224/81815; H01L 2224/83815; H01L 2224/92242; H01L 2225/06503; H01L 2225/06517; H01L 2225/06527; H01L 2225/06572; H01L 2924/13091; H01L 2924/19105; H01L 2924/15153; H01L 2224/73267; H01L 2224/18; H01L 2224/24137; H01L 2023/4087; H01L 2924/14252; H01L 2224/16245; H01L 2224/83851; H01L 2924/10253; H01L 2224/73215; H01L 2224/33181; H01L 2224/83191; H01L 2224/291; H01L 2224/2518; H01L 2224/04105; H01L 2224/83447; H01L 2924/00014; H01L 2924/014; H05K 1/0272; H05K 1/0203; H05K 1/185; H05K 2201/064; H05K 2201/10166; H02M 3/003; H02M 1/327; H02M 7/5387; H02M 7/003

USPC ......... 257/718, E23.084, 691, E25.015, 328, 257/690, 678, 327, 288, E25.014, 368; 361/719, 783, 704, 710, 707, 711, 709
See application file for complete search history.

(56) References Cited

U.S. PATENT DOCUMENTS

| | | | |
|---|---|---|---|
| 6,278,179 B1 | 8/2001 | Mermet-Guyennet | |
| 6,642,576 B1* | 11/2003 | Shirasawa | H01L 25/071 257/327 |
| 7,492,043 B2 | 2/2009 | Choi | |
| 7,808,101 B2 | 10/2010 | Liu | |
| 2002/0024129 A1* | 2/2002 | Hirahara | H01L 25/071 257/691 |
| 2004/0089934 A1* | 5/2004 | Shimoida | H01L 25/071 257/E25.015 |
| 2005/0184370 A1* | 8/2005 | Chiu | H01L 25/0652 257/E25.011 |
| 2007/0076355 A1* | 4/2007 | Oohama | H05K 7/20927 361/676 |
| 2007/0108560 A1* | 5/2007 | Tang | H01L 24/37 257/E23.044 |
| 2011/0057713 A1* | 3/2011 | Kawanami | H01L 25/16 361/728 |
| 2012/0162931 A1 | 6/2012 | Kim | |
| 2013/0015495 A1* | 1/2013 | Hauenstein | H05K 7/209 257/140 |
| 2013/0241043 A1* | 9/2013 | Kato | H01L 23/4334 257/715 |
| 2014/0063744 A1* | 3/2014 | Lopez | H01L 24/41 361/783 |
| 2014/0117408 A1* | 5/2014 | Kim | H01L 24/36 257/140 |
| 2014/0118956 A1 | 5/2014 | Kim | |
| 2014/0198449 A1* | 7/2014 | Osada | H01L 24/34 361/689 |
| 2017/0133294 A1* | 5/2017 | Ikeda | H01L 25/50 |
| 2018/0040593 A1* | 2/2018 | Zhou | H01L 23/5384 |
| 2018/0286774 A1* | 10/2018 | Nishibe | H02M 7/003 |
| 2019/0221493 A1* | 7/2019 | Chang | H01L 25/072 |
| 2020/0144162 A1* | 5/2020 | Chaowasakoo | H01L 23/49517 |
| 2020/0176354 A1* | 6/2020 | Matsuzawa | H01L 23/49575 |
| 2020/0365491 A1* | 11/2020 | Kawashima | H01L 23/49513 |
| 2022/0077021 A1* | 3/2022 | Avenas | H01L 23/58 |
| 2022/0084917 A1* | 3/2022 | Ohguro | H01L 23/3107 |

FOREIGN PATENT DOCUMENTS

| | | |
|---|---|---|
| JP | 2005303018 A | 10/2005 |
| WO | 2019201972 A1 | 10/2019 |

OTHER PUBLICATIONS

European Search Report for Corresponding Application Serial No. EP20851312, Dated Aug. 29, 2022, pp. 1-14.

\* cited by examiner

HIGH POWER DENSITY 3D SEMICONDUCTOR MODULE PACKAGING

RELATED APPLICATIONS

The present application is a U.S. National Stage application under 35 USC 371 of PCT Application Serial No. PCT/CN2020/125889, filed on 2 Nov. 2020; the entirety of which is incorporated herein by reference.

FIELD OF DISCLOSURE

The present application relates to semiconductor module packaging, particularly but not exclusively, to high power density, three-dimensional module packaging.

BACKGROUND

High power semiconductor packaging faces various challenges in order to meet the high standard requirements for automotive, aerospace, renewable energy and other applications. It is desired that semiconductor modules should be compact with high power density, and be able to operate in harsh environments for a relative long lifetime span (more than 15 years). Various devices have been provided that aim to improve the operational capability and stability at high temperatures, high humidity levels, under high mechanical shock and vibration, high radiation levels and other harsh environments. However, existing packaging structures, materials and technologies are unable to address all these issues in a single design.

One such state-of-the-art device is shown in FIG. 1, which shows two semiconductor chips in a package, in a planar configuration. The chips are each connected to two substrate layers, with a spacer in between one of the substrates and the semiconductor chips. In many devices, the substrate is ceramic. The package only has one layer of semiconductor chips, and so has a limited power density.

US 2014/0118956 also relates to a power semiconductor module, having two layers of substrate for attaching semiconductor devices, using wires. US 2012/0162931 relates to an assembly of power devices and control devices, attached on different substrates. U.S. Pat. No. 7,808,101 relates to a power module using a PCB to attach power devices and IC devices at either side of the PCB, and connecting another side of the power device to a conventional substrate. U.S. Pat. No. 7,492,043 relates to a power module flip chip package in which a single layer of devices are connected to on a carrier via conductive bumps.

SUMMARY

Aspects and preferred features are outlined in the accompanying claims.

According to a first aspect of the present disclosure, there is provided a semiconductor device sub-assembly comprising: at least two power semiconductor devices; and a contact of a first type, wherein a first power semiconductor device is located on a first side of the contact of a first type, and wherein a second power semiconductor device is located on a second side of the contact of a first type, wherein the second side is opposite to the first side.

The first side of the contact of a first type may be a top side or surface of the contact of a first type and the second side of the contact of a first type may be a bottom side or surface of the contact of a first type. The contact of a first type may be an emitter contact or terminal, or may be a collector contact or terminal.

By having semiconductor devices connected to opposite sides or surfaces of a contact or terminal, the semiconductor devices can be arranged in a 3D stack of devices, without the use of a baseplate or ceramic substrate. The density of power semiconductor devices in a given volume can be increased compared to state of the art devices, which allows for a sub-assembly with a higher power density.

The sub-assembly provides a compact and high reliability power IGBT module product. The 3D semiconductor chip stack has a baseplate and substrate free structure. Furthermore, flip chip, planar interconnection technology, and a high temperature and high humidity resistant epoxy compound may all be used in the sub-assembly or a package with a sub-assembly according to the disclosure. The electrical, thermal and mechanical performance are improved largely by the features of the sub-assembly, and the reliability of the sub-assembly is enhanced accordingly.

The sub-assembly has a low parasitic inductance due to the layout of laminated, planar terminals, the overlapping structure of the collector and emitter terminals, the large surface area of the terminals, and the planar interconnection using bonding wire free technology.

The sub-assembly has the following advantages over the state-of-the-art:
 (i) The sub-assembly provides a power semiconductor module with high power density, low parasitics, high efficiency, high operational temperature, and high reliability for high standard Automotive, Aerospace, Renewable power conversion system products;
 (ii) High power density by using 3D stack of semiconductor devices, which is baseplate and substrate free;
 (iii) Low parasitical inductance and resistance due to the power terminal structure and layout, and planar interconnection;
 (iv) Double side module cooling may be provided using heat sinks located on an outer surface of the sub-assembly;
 (v) High operational temperature, high humidity resistance and mechanical stability by using transfer molding encapsulation;
 (vi) A high power density sub-assembly in a discrete device packaging system.

The first power semiconductor device and the second power semiconductor device may be both directly connected to the contact of a first type.

The first power semiconductor device and the second power semiconductor device may be connected to the contact of a first type in a flip-chip stack assembly.

The sub-assembly may further comprise at least two contacts of a second type, wherein one of the contacts of a second type is connected to a top side of the first power semiconductor device and another of the contacts of a second type is connected to a bottom side of the second power semiconductor device. The contacts of a second type may be collector contacts or terminals, or may be emitter contacts or terminals.

The semiconductor device sub-assembly may further comprise a spacer, and the contacts of a second type may be electrically connected to each other using the spacer. The spacer layer may be only present between the contacts, and not between the power semiconductor devices and the contact. This means that the spacer layer does not prevent connection between the power devices and the contact, so that an additional layer of semiconductor devices can be formed on top of the contacts.

The sub-assembly may comprise at least four semiconductor devices arranged in at least two layers of semiconductor devices. Semiconductor devices within each layer of semiconductor devices may be spaced apart from each other in a first dimension, and the layers of semiconductor devices may be spaced apart from each other in a second dimension, where the first dimension is perpendicular to the second dimension.

The contact of a first type may be connected to all of the at least four semiconductor devices.

The at least four power semiconductor devices may be connected in parallel and/or antiparallel to form a single switch.

The sub-assembly may comprise at least two contacts of a first type laterally spaced from each other in the first dimension, where a semiconductor device from each layer of semiconductor devices may be connected to each contact of a first type.

The sub-assembly may comprise at least four contacts of a second type, and a semiconductor device may be connected to each of the contacts of a second type. At least two contacts of a second type may be connected to a top side of the semiconductor devices in a first layer of the two layers of semiconductor devices, and at least two other contacts of a second type may be connected to a bottom side of the semiconductor devices in a second layer of the two layers of semiconductor devices.

The first side of the semiconductor devices may be a top side and the second side of the semiconductor devices may be a bottom side, where the first side and the second side may be opposite sides.

A contact of a first type may be connected to a contact of a second type.

The at least four power semiconductor devices may be arranged in a half-bridge configuration. The half bridge configuration is useful as it is easy and flexible for power system configuration, The sub-assembly may comprise at least four layers of semiconductor devices. Semiconductor devices in the first layer of semiconductor devices may be located on a first side of a first contact of a first type, and semiconductor devices in the second layer of semiconductor devices may be located on a second side of the first contact of a first type. Semiconductor devices in the second layer of semiconductor devices may be located on a first side of a first contact of a second type, and semiconductor devices in the third layer of semiconductor devices may be located on a second side of the first contact of a second type. Semiconductor devices in the third layer of semiconductor devices may be located on a first side of a second contact of a first type, and semiconductor devices in the fourth layer of semiconductor devices may be located on a second side of the second contact of a first type. The first side of each contact may be a top side and the second side of each contact may be a bottom side, where the first side and the bottom side are opposite sides.

The first and second contacts of a first type may be connected to each other.

The power semiconductor devices may be insulated gate bipolar transistors (IGBTs) or fast recovery diodes (FRDs). The semiconductor devices may be formed of SiC or GaN.

The semiconductor device sub-assembly may further comprise heat sinks located on an outer surface of the contacts of a second type. The heat sinks may be formed on a top surface and a bottom surface of the sub-assembly. These cool the semiconductor device chips, improving the reliability of the sub-assembly and allowing the sub-assembly module to operate at a higher output power level.

The sub-assembly may comprise at least one substrate structure, wherein the substrate structure is located between the power semiconductor devices and the contacts. The substrate structure may be direct bonded copper (DBC) substrate. The substrate structure may be directly connected to the semiconductor devices and the contacts (metal terminals) may extend from the metal of the DBC. This still allows a 3D stack of semiconductor devices whilst providing isolation.

According to a further aspect of the present disclosure, there is provided a semiconductor device package, comprising a semiconductor device sub-assembly as described above, wherein the sub-assembly is encapsulated in a molding compound.

According to a further aspect of the present disclosure, there is provided a method of manufacturing a semiconductor device package, wherein the method comprises:
  forming at least two contacts of a second type;
  forming at least two power semiconductor devices with at least one semiconductor device on each contact of a second type;
  forming a contact of a first type; and
  forming a stack of the semiconductor devices by connecting a first semiconductor device of the power semiconductor devices to a first (top) side of the contact of a first type, and connecting a second power semiconductor device of the power semiconductor devices to a second (bottom) side of the contact of a first type, wherein the second side is opposite to the first side, and such that one of the contacts of a second type is connected to a top side of the first power semiconductor device and another of the contacts of a second type is connected to a bottom side of the second power semiconductor device.

The method may further comprise: placing the stack of semiconductor devices in a frame; filling the frame with a molding compound; and curing the molding compound. This method of transfer molding encapsulation improves the resistance to high temperatures and high humidity, and mechanical stability of the semiconductor device package.

BRIEF DESCRIPTION OF THE FIGURES

Some preferred embodiments of the invention will now be described, by way of example only and with reference to the accompanying drawings, in which.

DETAILED DESCRIPTION OF THE PREFERRED EMBODIMENTS

Figure 1:
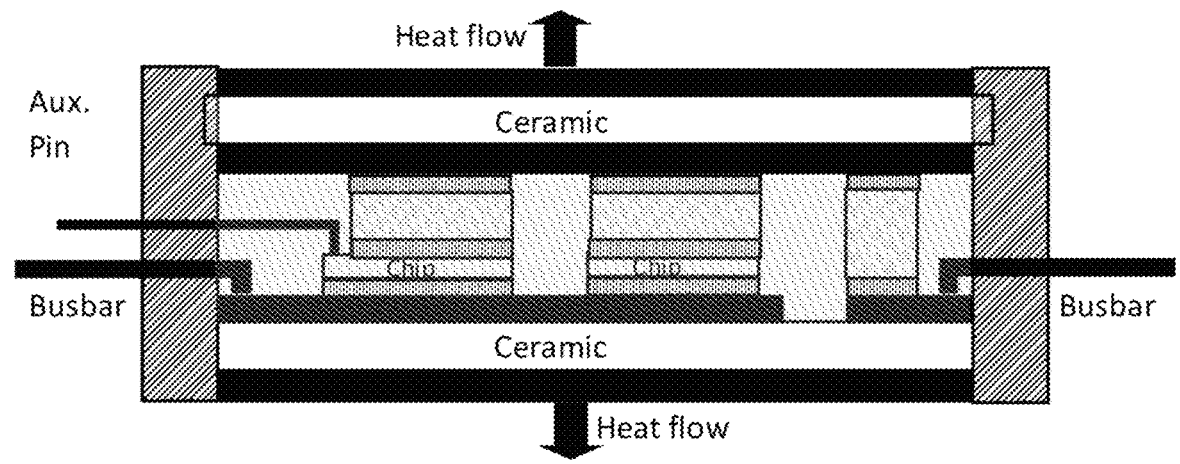
FIG. 1 illustrates a semiconductor device sub-assembly according to the state of the art.
Figure 2:
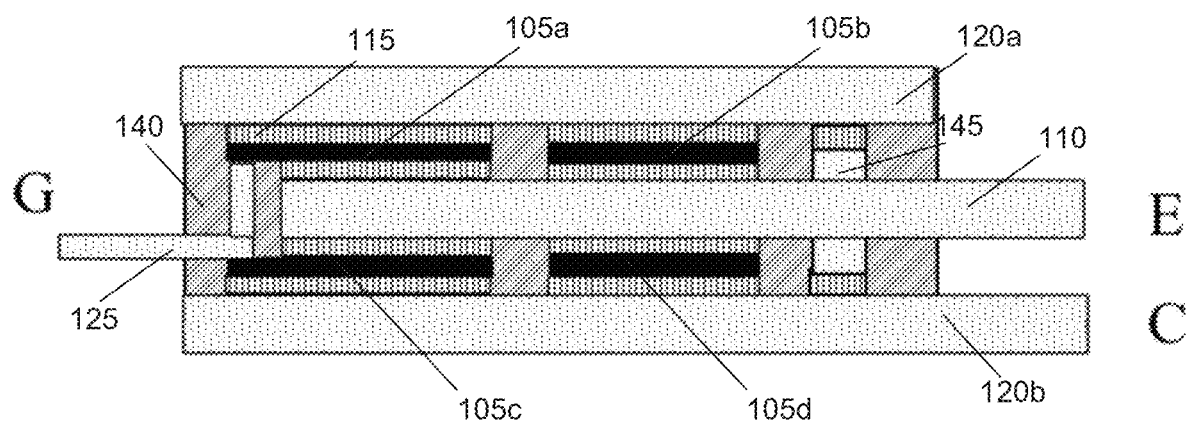
FIG. 2 illustrates a semiconductor device sub-assembly according to an embodiment of the disclosure.

FIG. 2 illustrates a schematic cross-sectional view of a semiconductor device sub-assembly 100 according to an embodiment. In this embodiment, the sub-assembly has four power semiconductor device chips 105a, 105b, 105c, and 105d. The power devices may be insulated gate bipolar transistors (IGBTs) or fast recovery diodes (FRDs). All four power device chips 105 are directly connected to an emitter contact 110 using a soldering or sintering interface 115.

The power device chips 105 are arranged in a 3D configuration, so there are two layers of power semiconductor device chips. The first layer includes chips 105a and 105b, and the second layer includes chips 105c, 105d. Chips within each layer are laterally spaced from each other in a first dimension, and the layers themselves are spaced in a second dimension perpendicular to the first dimension. Both semiconductor devices in the first layer of chips 105a, 105b are located on a top side of the emitter contact 110, and both semiconductor devices in the second layer of chips 105c, 105d are located on a bottom, opposite side of the same emitter contact 110. The power semiconductor devices 105a, 105b, 105c, 105d are connected to the contacts 110, 120 in a flip chip stack assembly.

The sub-assembly has a collector contact 120a formed on a top surface of and connected to both power devices 105a, 105b in the first layer of semiconductor devices. The sub-assembly has another collector contact 120b formed on a bottom surface of and connected to both power devices 105c, 105d in the second layer of semiconductor devices. In this embodiment, the collector contacts 120a, 120b are electrically connected to each other with metal spacers 145. By connecting the collector contacts 120a, 120b with the spacer 145, the sub-assembly module has one collector terminal, so the connection in application power system will be simpler. Compared to state-of-the-art devices, this only uses only one spacer to form a circuit, meaning assembly of the sub-assembly is easier.

A gate contact 125 is connected to a first power device 105a, 105c in each layer of power devices. The sub-assembly is enclosed in an epoxy molding compound (EMC) encapsulation 140. The EMC compound encapsulation 140 allows the emitter and collector contacts 120, 110 to extend out of the EMC, but also the top and bottom surfaces of the copper collector contacts 120 to be exposed for cooling, and so that they can be attached to a heat sink if desired.

Figure 3:
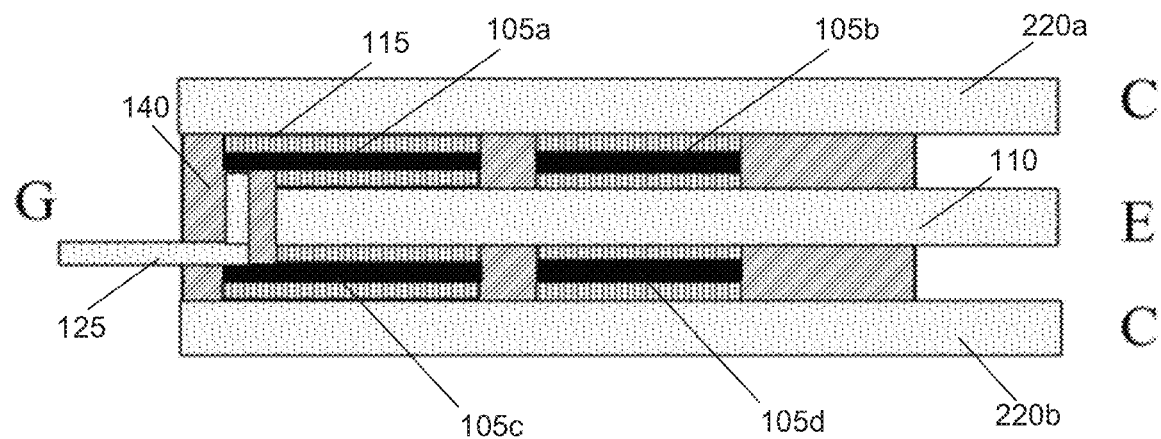
FIG. 3 illustrates an alternative semiconductor device sub-assembly according to an embodiment of the disclosure, in which the sub-assembly has two collector contacts.

FIG. 3 illustrates an alternative semiconductor device sub-assembly according to an embodiment of the disclosure, in which the sub-assembly has two collector contacts that are not connected. Many of the features in this embodiment are the same as those shown in FIG. 2 and therefore carry the same reference numerals. In this embodiment, the collector contacts 220a, 220b are not electrically connected to each other. By not having a spacer, the assembly process is simpler and the size/volume of the sub-assembly can be reduced giving a higher power density.

In this embodiment, and in the embodiment of FIG. 2, chips 105a and 105c are both connected in parallel to each other, and chips 105b and 105d are both connected in parallel to each other. In this example, chips 105a and 105c are IGBT chips and chips 105b and 105d are FRD chips, although they could be arranged vice versa. The IGBT chips 105a, 105c are connected to the FRD chips 105b, 105d in an anti-parallel configuration (connected in parallel with polarities reversed) in the power semiconductor module.

Figure 4A:
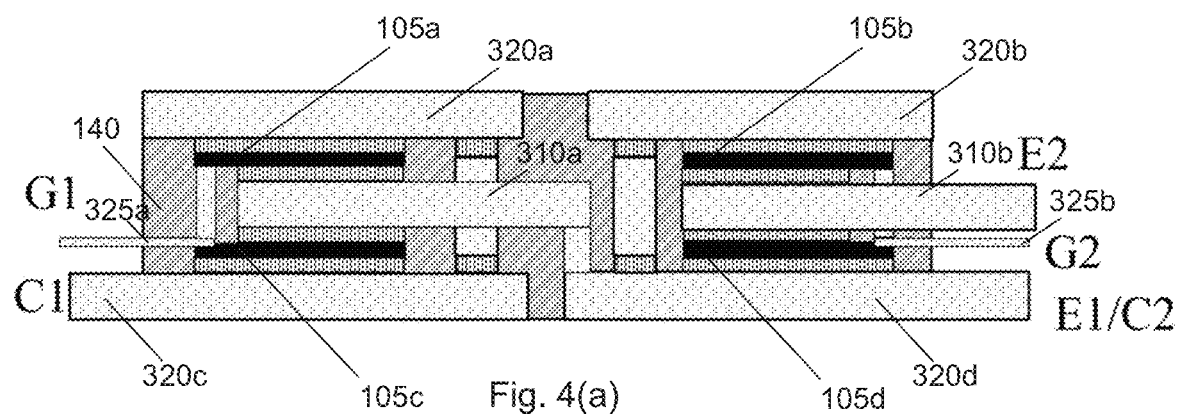
FIG. 4 illustrates an alternative semiconductor device sub-assembly according to an embodiment of the disclosure, in which the sub-assembly has a half-bridge configuration.
Figure 4B:
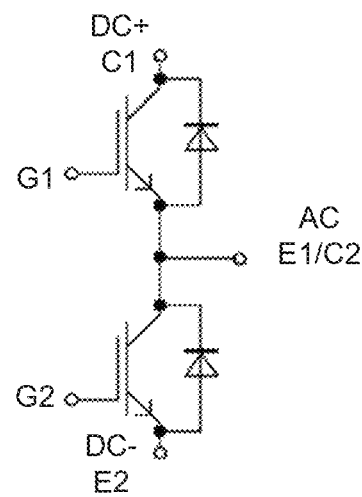

FIG. 4(a) illustrates an alternative semiconductor device sub-assembly according to an embodiment of the disclosure, in which the sub-assembly has a half-bridge configuration. FIG. 4(b) shows a circuit diagram of the semiconductor sub-assembly of FIG. 4(a). Many of the features in this embodiment are similar to those shown in FIG. 2 and therefore carry the same reference numerals. In this embodiment, the power device chips 105 are also arranged in a 3D configuration, so there are two layers of power semiconductor device chips. The first layer includes chips 105a and 105b, and the second layer includes chips 105c, 105d.

The semiconductor sub-assembly has two emitter contacts 310a, 310b. A first chip 105a of the first layer and a first chip 105c of the second layer are connected to the first emitter contact 310a. A second chip 105b of the first layer and a second chip 105d of the second layer are connected to the second emitter contact 310b.

The device has four collector contacts 320a, 320b, 320c, 320d, each directly connected to a separate power semiconductor device. The collector contact 320a of the first power device 105a in the first layer is connected to the collector contact 302c of the first power device 302c in the second layer, and the collector contact 320b of the second power device 105c in the first layer is connected to the collector contact 302d of the second power device 302d in the second layer. In this embodiment, the power devices are connected in a series configuration. The emitter contact 310a which is connected to the first power device 105a, 105c of each layer, is connected to the collector contact 320d of the second power device in the lower layer 105d. A gate contact 325a is connected to a first power device 105a, 105c, in each layer of power devices, and a gate contact 325b is connected to a second power device in each layer of power devices.

The semiconductor sub-assembly has two separate switches (top and bottom switches shown in FIG. 4(b)) forming the half bridge topology. The separate switches are connected to each other in series. The sub-assembly has three terminals DC+, DC− and AC, with the AC output from the middle.

Figure 5:
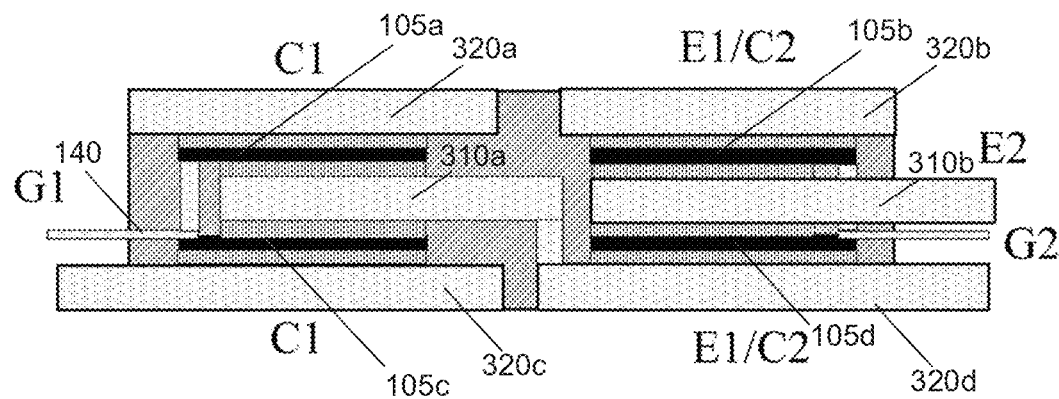
FIG. 5 illustrates an alternative semiconductor device sub-assembly according to a further embodiment of the disclosure, in which the sub-assembly has an alternative half-bridge configuration.

In FIG. 4(a), the left side of the device (chips 105a and 105c) is the top switch and the right side (chips 105b and 105d) is the bottom switch. The contact 320c (C1) is the DC+ terminal, contact 310b (E2) is the DC− terminal, and the contact 320d (E1/C2) is the AC terminal. The half bridge configuration is useful as it is easy and flexible for power system configuration, FIG. 5 illustrates an alternative semiconductor device sub-assembly according to a further embodiment of the disclosure, in which the sub-assembly has an alternative half-bridge configuration. Many of the features in this embodiment are similar to those shown in FIG. 4 and therefore carry the same reference numerals. In this embodiment, the collector contacts 320a, 320c, and 320b, 320d are not electrically connected to each other.

Figure 6:
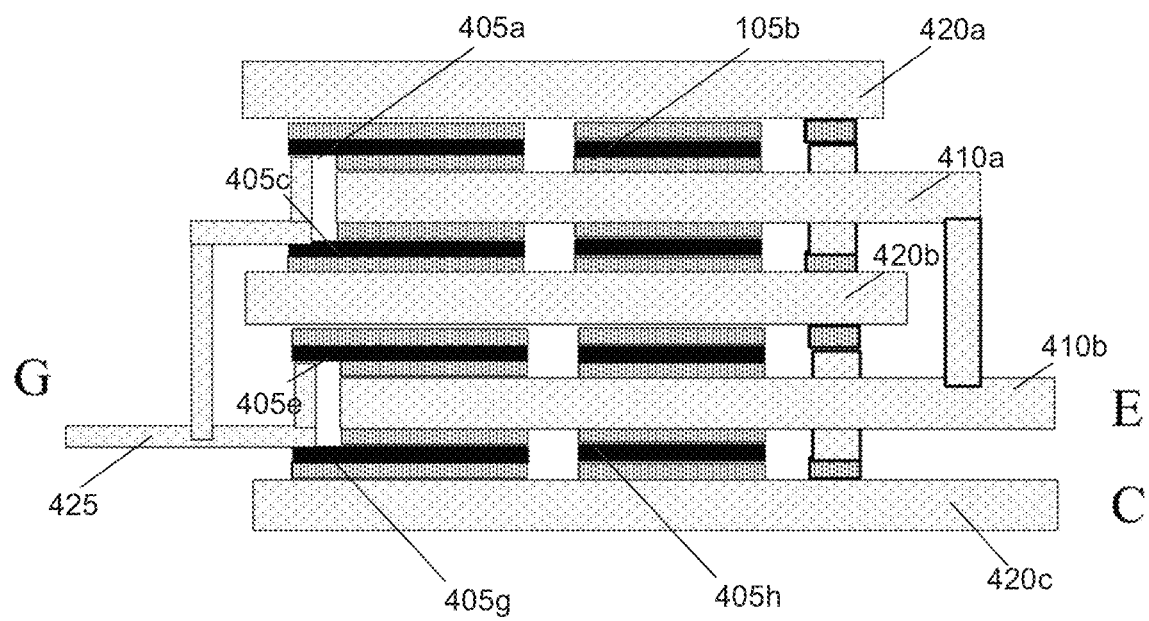
FIG. 6 illustrates an alternative semiconductor device sub-assembly according to an embodiment of the disclosure, in which the sub-assembly has four layers of chips.

FIG. 6 illustrates an alternative semiconductor device sub-assembly according to an embodiment of the disclosure, in which the sub-assembly has four layers of chips. In this embodiment, two sub-assemblies similar to that of FIG. 2 are stacked, with a central collector contact connected to two layers of semiconductor chips. By increasing the number of layers of semiconductor chips, the power density and power level of a single module can be increased.

In this embodiment, the collector contacts 420a, 420b, 420c are electrically connected to each other. By connecting the collector contacts 420a, 420b, 420c, the sub-assembly module has one collector terminal, so the connection in application power system will be simpler. The emitter contacts 410a, 410b are also electrically connected to each other. A gate contact 425 is connected to a first power device 405a, 405c, 405e, 405g in each layer of power devices.

Figure 7:
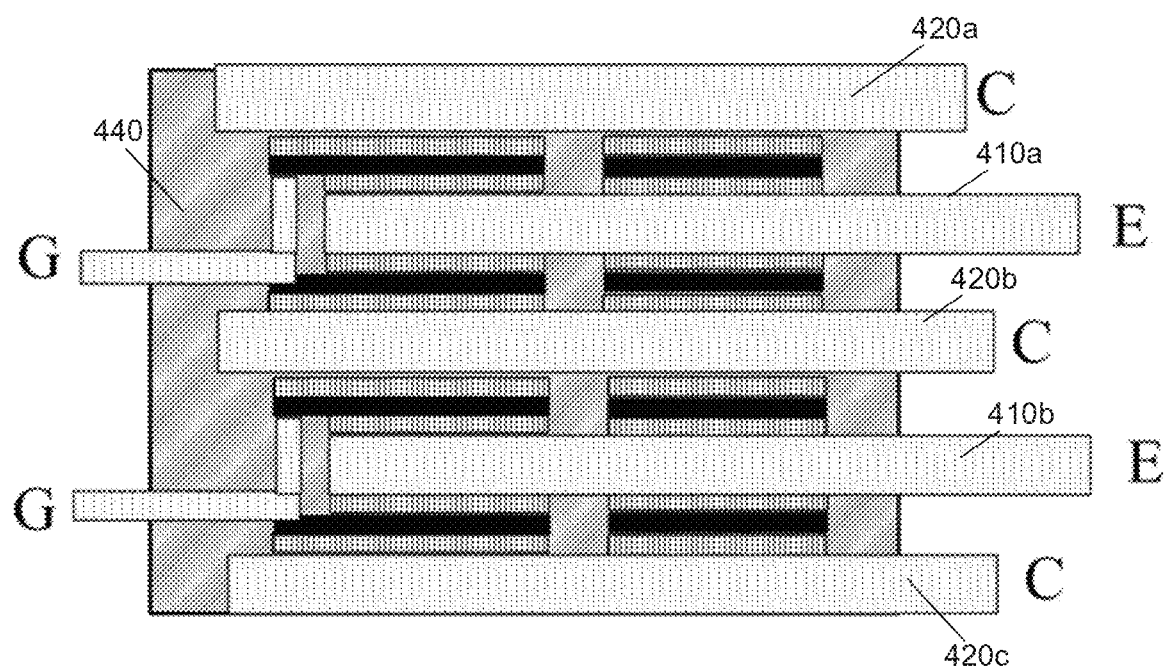
FIG. 7 illustrates an alternative semiconductor device sub-assembly according to an embodiment of the disclosure, in which the sub-assembly has four layers of chips and in which the sub-assembly is packaged in a molding compound encapsulation.

FIG. 7 illustrates an alternative semiconductor device sub-assembly according to an embodiment of the disclosure, in which the sub-assembly has four layers of chips and in which the sub-assembly is packaged in an epoxy molding compound encapsulation 440. Many of the features are similar to those shown in FIG. 6 and therefore have the same reference numerals. In this embodiment, the collector contacts 420a, 420b, 420c are not electrically connected to each other, and the emitter contacts 410a, 410b are not collected to each other. By not having a spacer connecting the contacts, the assembly process is simpler and the size/volume of the sub-assembly can be reduced giving a higher power density.

Figure 8:
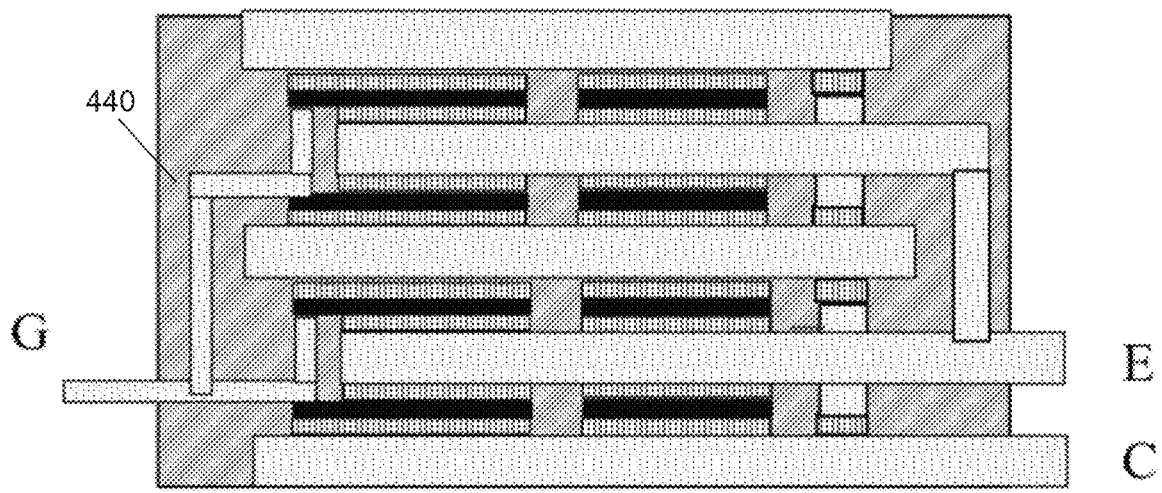
FIG. 8 illustrates an alternative semiconductor device sub-assembly according to a further embodiment of the disclosure, in which the sub-assembly has four layers of chips and in which the sub-assembly is packaged in a molding compound encapsulation.

FIG. 8 illustrates an alternative semiconductor device sub-assembly according to a further embodiment of the disclosure, in which the sub-assembly has four layers of chips and in which the sub-assembly is packaged in a molding compound encapsulation 440. This embodiment is the same as the embodiment of FIG. 6, however the sub-assembly is packaged in an epoxy molding compound encapsulation 440.

Figure 9:
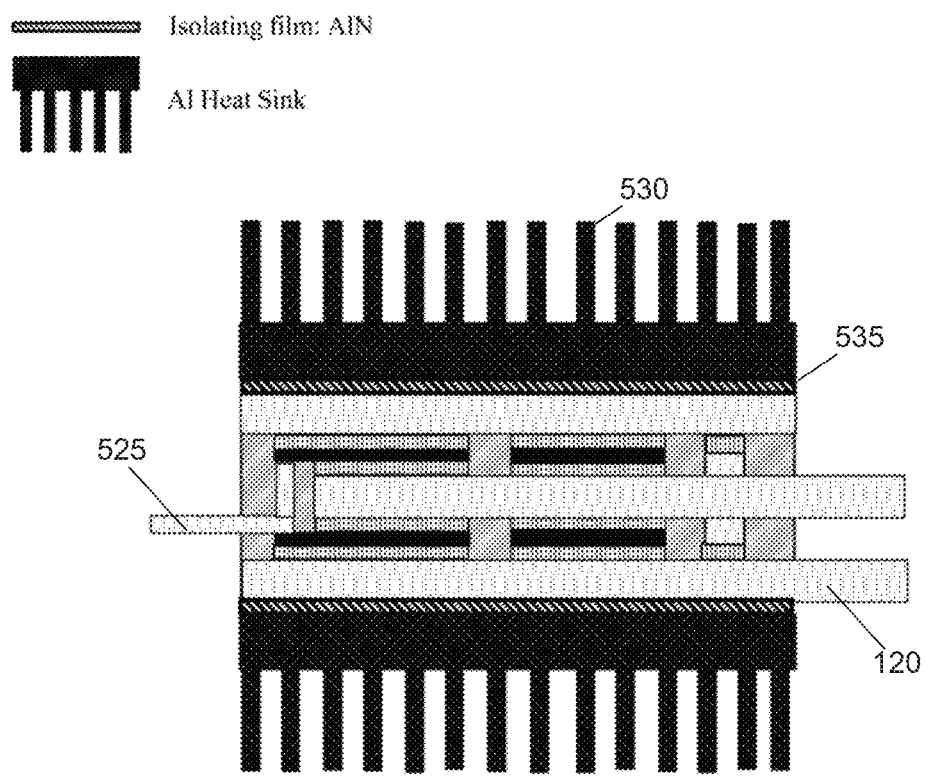
FIG. 9 illustrates an alternative semiconductor device sub-assembly according to an embodiment of the disclosure, in which the sub-assembly has double side module liquid cooling.

FIG. 9 illustrates an alternative semiconductor device sub-assembly according to an embodiment of the disclosure, in which the sub-assembly has double side module liquid cooling. In this embodiment, heat sinks 530 are formed on the top and bottom surfaces of the sub-assembly. The heat sinks 530 may be Aluminium heat sinks with cooling fins. An Aluminium Nitrate isolating film 535 is located between the heat sinks 530 and the collector contacts 120 of the sub-assembly. Double side cooling increases the cooling efficiency, and reduces the junction to coolant thermal resistance. The chip will be cooler, so the reliability is enhanced. Additionally, the sub-assembly module will be capable of operating at high output power level.

Figure 10:
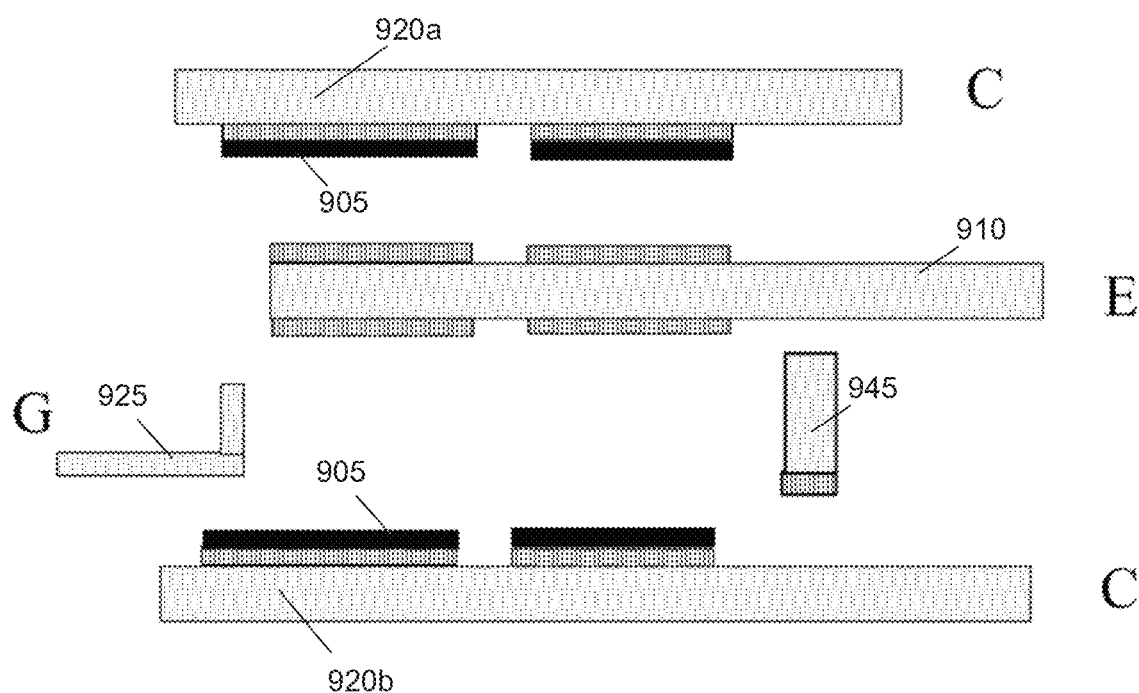
FIG. 10 illustrates an expanded view of a semiconductor device sub-assembly according to an embodiment of the disclosure, during a manufacturing process of the semiconductor device sub-assembly.

FIG. 10 illustrates an expanded view of a semiconductor device sub-assembly according to an embodiment of the disclosure, during a manufacturing process of the semiconductor device sub-assembly.

The manufacturing method includes the steps of:
1) A first layer of die each having a power semiconductor device chip 905 are attached to the bottom surface of a first (top) collector power lead or terminal 920a and a second layer of die each having a power semiconductor device 905 chip are attached to the top surface of a second (bottom) collector power lead or terminal 920b. The die may be attached using lead free soldering or Ag/Cu low temperature sintering;
2) The first and second collector power terminals 920a, 920b are stacked with an emitter contact 910 in between them, and soldering on the top and bottom surfaces of the emitter contact. A gate pin 925 is attached to the top and bottom collector terminals, and the top and bottom collector terminals are connected by a metal spacer 945. The stack may use lead free soldering or Ag/Cu low temperature sintering;
3) The sub-assembly stack is placed into a fixture, and epoxy molding compound is injected into the fixture under high pressure and temperature (for example, at approximately 50 MPa and 250° C. The assembly is then cured at a high temperature (for example, at approximately 125° C.). The fixture may be a plastic frame attached on the power terminals (the contacts). The frame may be filled with an epoxy molding compound or a silicone gel.

The skilled person will understand that in the preceding description and appended claims, positional terms such as 'above', 'overlap', 'under', 'lateral', etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device sub-assembly comprising:
at least two power semiconductor devices; and
a contact of a first type, wherein a first power semiconductor device is located on a first side of the contact of a first type, and wherein a second power semiconductor device is located on a second side of the contact of a first type, wherein the second side is opposite to the first side;
at least two contacts of a second type, wherein one of the contacts of a second type is connected to a top side of the first power semiconductor device and another of the contacts of a second type is connected to a bottom side of the second power semiconductor device; and
a spacer, wherein the contacts of a second type are electrically connected to each other using the spacer.

2. A semiconductor device sub-assembly according to claim 1, wherein the first power semiconductor device and the second power semiconductor device are both directly connected to the contact of a first type.

3. A semiconductor device sub-assembly according to claim 1, wherein the first power semiconductor device and the second power semiconductor device are connected to the contact of a first type in a flip-chip stack assembly.

4. A semiconductor device sub-assembly according to claim 1, comprising at least one substrate structure, wherein the substrate structure is located between at least one power semiconductor device and the contact of a first type or the contact of a second type.

5. A semiconductor device sub-assembly according to claim 1, further comprising heat sinks located on an outer surface of the contacts of a second type.

6. A semiconductor device sub-assembly according to claim 1, wherein the sub-assembly comprises at least four semiconductor devices arranged in at least two layers of semiconductor devices, and
wherein devices within each layer of semiconductor devices are spaced apart from each other in a first dimension, and
wherein the layers of semiconductor devices are spaced apart from each other in a second dimension, and wherein the first dimension is perpendicular to the second dimension.

7. A semiconductor device sub-assembly according to claim 6, wherein the contact of a first type is connected to all of the at least four semiconductor devices.

8. A semiconductor device sub-assembly according to claim 6, wherein the at least four power semiconductor devices are connected in parallel and/or antiparallel to form a single switch.

9. A semiconductor device sub-assembly according to claim 6, wherein the sub-assembly comprises at least two contacts of a first type laterally spaced from each other in the first dimension, and wherein a semiconductor device from each layer of semiconductor devices is connected to each contact of a first type.

10. A semiconductor device sub-assembly according to claim 9, wherein the sub-assembly comprises at least four contacts of a second type, and
wherein a semiconductor device is connected to each of the contacts of a second type, and
wherein at least two contacts of a second type are connected to a top side of the semiconductor devices in a first layer of the two layers of semiconductor devices, and
wherein at least two other contacts of a second type are connected to a bottom side of the semiconductor devices in a second layer of the two layers of semiconductor devices.

11. A semiconductor device sub-assembly according to claim 10, wherein at least one of the contacts of the first type is connected to at least one of the contacts of the second type.

12. A semiconductor device sub-assembly according to claim 9, wherein the at least four power semiconductor devices are arranged in a half-bridge configuration.

13. A semiconductor device sub-assembly according to claim 6, wherein the sub-assembly comprises at least four layers of semiconductor devices, and
wherein semiconductor devices in the first layer of semiconductor devices are located on a first side of a first contact of a first type, and wherein semiconductor devices in the second layer of semiconductor devices are located on a second side of the first contact of a first type, and
wherein semiconductor devices in the second layer of semiconductor devices are located on a first side of a first contact of a second type, and wherein semiconductor devices in the third layer of semiconductor devices are located on a second side of the first contact of a second type, and
wherein semiconductor devices in the third layer of semiconductor devices are located on a first side of a second contact of a first type, and wherein semiconductor devices in the fourth layer of semiconductor devices are located on a second side of the second contact of a first type.

14. A semiconductor device sub-assembly according to claim 13, wherein the first and second contacts of a first type are connected to each other.

15. A semiconductor device sub-assembly according to claim 1, wherein the power semiconductor devices are insulated gate bipolar transistors (IGBTs) and/or fast recovery diodes (FRDs).

16. A semiconductor device package, comprising a semiconductor device sub-assembly according to claim 1, wherein the sub-assembly is encapsulated in a molding compound.

17. A method of manufacturing a semiconductor device package, wherein the method comprises:
forming at least two contacts of a second type;
forming at least two power semiconductor devices with at least one semiconductor device on each contact of a second type;
forming a contact of a first type;
forming a stack of the semiconductor devices by connecting a first semiconductor device of the power semiconductor devices to a first (top) side of the contact of a first type, and connecting a second power semiconductor device of the power semiconductor devices to a second (bottom) side of the contact of a first type, wherein the second side is opposite to the first side, and such that one of the contacts of a second type is connected to a top side of the first power semiconductor device and another of the contacts of a second type is connected to a bottom side of the second power semiconductor device; and
forming a spacer, wherein the contacts of a second type are electrically connected to each other using the spacer.

18. A method according to claim 17, further comprising:
placing the stack of semiconductor devices in a frame;
filling the frame with a molding compound; and
curing the molding compound.

* * * * *